(12) United States Patent
Starreveld et al.

(10) Patent No.: US 8,184,266 B2
(45) Date of Patent: May 22, 2012

(54) LITHOGRAPHIC APPARATUS AND DEVICE MANUFACTURING METHOD

(75) Inventors: Jeroen Pieter Starreveld, Eindhoven (NL); Bastiaan Lambertus Wilhelmus Marinus Van De Ven, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 584 days.

(21) Appl. No.: 12/393,369

(22) Filed: Feb. 26, 2009

(65) Prior Publication Data
US 2009/0246703 A1    Oct. 1, 2009

Related U.S. Application Data (60) Provisional application No. 61/064,771, filed on Mar. 26, 2008.

(51) Int. Cl.
*G03B 27/58* (2006.01)
*G03B 27/62* (2006.01)

(52) U.S. Cl. ......................... 355/72; 355/75
(58) Field of Classification Search ............. 355/72, 355/75, 53, 77
See application file for complete search history.

(56) References Cited

U.S. PATENT DOCUMENTS
7,140,861 B2    11/2006    Watts et al.
2008/0236997 A1*   10/2008   Ebihara ................ 198/618

FOREIGN PATENT DOCUMENTS

| | | | |
|---|---|---|---|
| JP | 2000-018301 A | 1/2000 | |
| JP | 2001-102286 A | 4/2001 | |
| JP | 2005-030486 A | 2/2005 | |
| JP | 2007-535172 A | 11/2007 | |
| WO | WO 2006/022200 | * | 3/2006 |

OTHER PUBLICATIONS

Machine translation of JP 2005-30486, Feb. 2005.*
English-Language Abstract of Japanese Patent Publication No. 2000-018301 A, published Jan. 18, 2000; 1 page.
English-Language Abstract of Japanese Patent Publication No. 2001-102286 A, published Apr. 13, 2001; 1 page.
English-Language Abstract of Japanese Patent Publication No. 2005-030486 A, published Feb. 3, 2005; 1 page.
English-Language Translation of Notice of Reasons for Rejection directed to related Japanese Patent Application No. 2009-067141, mailed Jul. 14, 2011, Japanese Patent Office; 4 pages.

* cited by examiner

*Primary Examiner* — Peter B Kim
(74) *Attorney, Agent, or Firm* — Sterne, Kessler, Goldstein & Fox P.L.L.C.

(57) ABSTRACT

A lithographic apparatus includes an illumination system, a support, a substrate table, a projection system, and an actuator. The illumination system is configured to condition a radiation beam. The support is constructed to support a patterning device. The patterning device is capable of imparting the radiation beam with a pattern in its cross-section to form a patterned radiation beam. The substrate table is constructed to hold a substrate. The projection system is configured to project the patterned radiation beam onto a target portion of the substrate. The actuator is constructed and arranged to exert a force on a part of the lithographic apparatus via an elongated structure. The elongated structure is provided with a vibration damper constructed and arranged to damp vibrations in the elongated structure.

11 Claims, 5 Drawing Sheets

LITHOGRAPHIC APPARATUS AND DEVICE MANUFACTURING METHOD

CROSS REFERENCE TO RELATED APPLICATIONS

This application claims benefit under 35 U.S.C. §119(e) to U.S. Provisional Patent Application No. 61/064,771, filed Mar. 26, 2008, which is incorporated by reference herein in its entirety.

BACKGROUND

1. Field of the Invention

The present invention relates to a lithographic apparatus and methods.

2. Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may be provided with an actuator configured to exert a force on certain parts within the lithographic apparatus. For example, a positioning system may be provided with an actuator to position a support constructed and arranged to hold a patterning device and/or may be used to position a substrate table constructed to hold a substrate. The positioning system may be provided with an elongated structure, for example, a so-called beam configured to transfer the forces of the actuator to the support and/or the object table. The elongated structure may be sensitive to vibrations leading to inaccuracies in the positioning system and/or risks that certain parts of the drive may fail.

SUMMARY

It is desirable to improve the positioning system for positioning parts in the lithographic apparatus.

According to an embodiment of the invention, there is provided a lithographic apparatus including an illumination system, a support, a substrate table, a projection system, and an actuator. The illumination system is configured to condition a radiation beam. The support is constructed to support a patterning device. The patterning device is capable of imparting the radiation beam with a pattern in its cross-section to form a patterned radiation beam. The substrate table is constructed to hold a substrate. The projection system is configured to project the patterned radiation beam onto a target portion of the substrate. The actuator is constructed and arranged to exert a force on a part of the lithographic apparatus via an elongated structure. The elongated structure is provided with a vibration damper constructed and arranged to damp vibrations in the elongated structure.

According to another embodiment of the invention a device manufacturing method is provided including the following steps. Providing a substrate that is at least partially covered by a layer of radiation-sensitive material on a substrate table. Providing a patterning device on a support. Projecting a patterned beam of radiation onto the layer of radiation sensitive material. Exerting a force on the substrate table and/or the support with an actuator via an elongated structure. Substantially suppressing vibrations within the elongated structure with a vibration damper.

In one example, the method may further include developing the layer of sensitive material on the substrate; and manufacturing a device from the developed substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
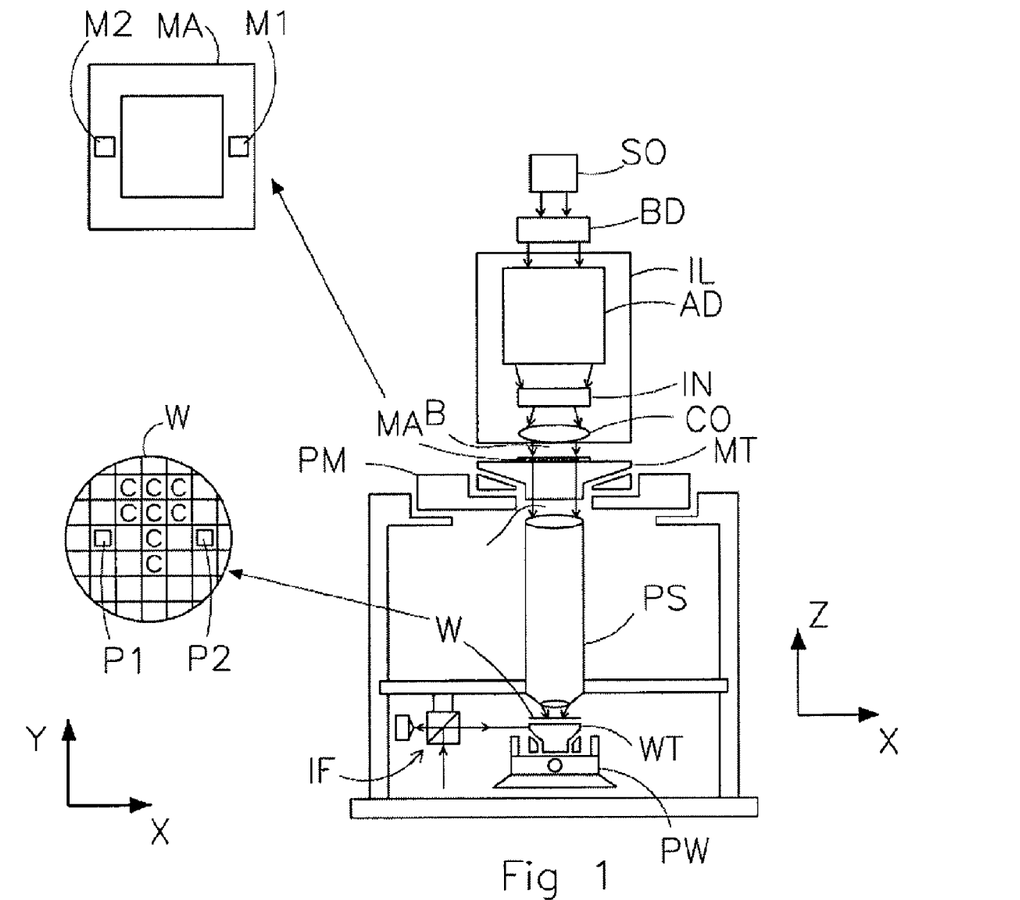
FIG. 1 depicts a lithographic apparatus, according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a patterning device support or support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed. Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies.

The depicted apparatus could be used in at least one of the following modes:

1. In step mode, the patterning device support (e.g., mask table) MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the patterning device support (e.g., mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
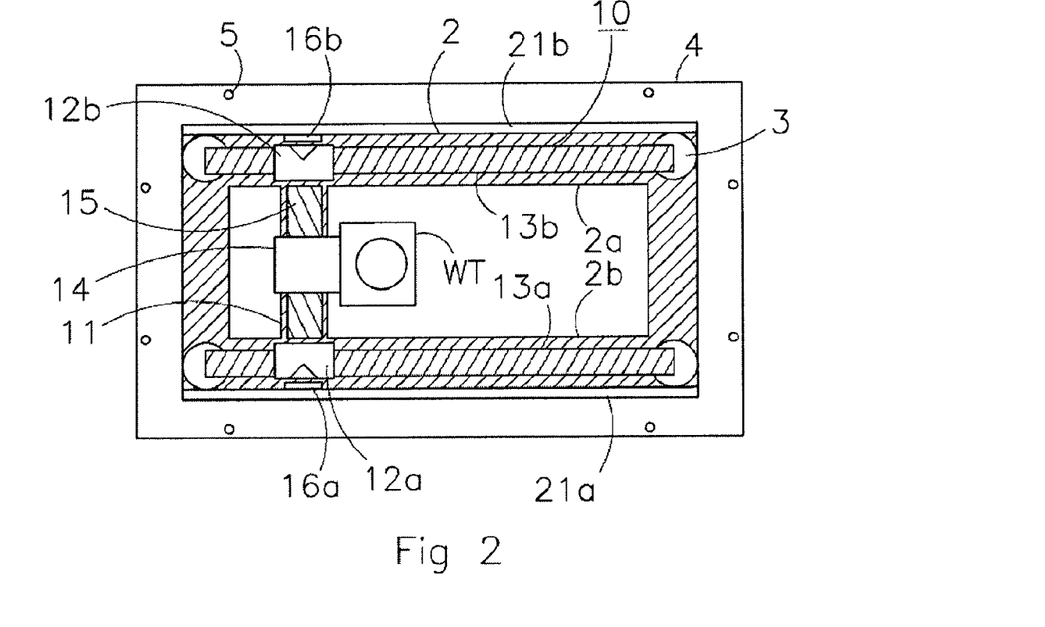
FIG. 2 is a planar view of an H drive, according to an embodiment of the invention.

FIG. 2 is a planar view of an H drive, according to an embodiment of the invention. A positioning system 10 is placed within or above a balance frame 2, which is supported by substantially frictionless bearings on a guide surface 4. The positioning system 10 and the balancing frame 2 are movable over the guide surface 4 so that reaction forces of the positioning system 10 may be cancelled by movement of the balance frame 2 and the positioning system 10. The positioning system 10 provides for large movements of the substrate table over relatively large ranges of movement in the X and Y directions. It is desirable that the center of mass of the positioning system 10 be close as possible in the Z direction to the center of mass of the balance frame 2. In particular, it is preferred that the vertical separation of the two centers of mass be substantially less than about 100 mm and ideally zero. Elastic posts or buffers 5 limit the movement of the balance frame 2 to prevent it from leaving the guide surface 4.

The positioning system 10 may be referred to as a H-drive. The H-drive 10 includes an elongated structure, for example X-beam 11 mounted at or near its ends to respective sliders 12a, 12b. Sliders 12a, 12b carry armatures of linear motors that act in concert with elongate magnet tracks 13a, 13b, which are mounted in the long sides 2a, 2b of rectangular balance frame 2, as an actuator to exert a force on X-beam 11 in the Y-direction. The object to be positioned, in this case wafer table WT, is driven in the XY plane by a further slider 14 which is positioned on X-beam 11. Slider 14, similarly to sliders 12a, 12b, carries the armature of a linear motor to act against a magnet track 15 mounted in X-beam 11 to translate slider 14 along the X-beam and hence position wafer table WT in the X direction. Independent control of the position of sliders 12a, 12b allows the angle between X-beam 11 and the balance frame to be varied and hence the Rz (rotation about the Z-axis) position of the wafer table WT to be controlled within a certain range to compensate for any yaw movements of the balance frame. It will be appreciated that, for this reason and also due to distortion of the balance frame caused by shear components in the resultant force on the balance frame, the X and Y directions in which the drivers exert forces may not always be exactly orthogonal. By this arrangement, the reaction forces in the Y and Rz directions are transferred directly to the balance frame 2. Sliders 12a, 12b also carry air bearings 16a, 16b which act against upstanding walls 21a, 21b provided on the balance frame 2 to transmit reaction forces in the X direction to balance frame 2. Instead of a pair of thrust bearings 16a, 16b to transmit the X direction forces, a single pre-loaded bearing or an opposed pad bearing, for example, may be used on one of the two sides and is often preferred as it avoids difficulties with cosine shortening when the X-beam 11 is not perpendicular to the balance frame 2.

As illustrated, the positioning system is supported in the Z direction and against Rx, Ry rotations by the balance frame. This function can also be performed by the guide surface 4 for the whole or a part of the positioning system (e.g., the wafer table WT) by a separate surface or surfaces fixed relative to the base frame, or by a combination of the above.

The X-beam 11 will be moved in the Y-direction by the armatures of linear motors in the sliders 12a and 12b that act together with elongate magnet tracks 13a, 13b to move the wafer table WT in the Y-direction. Since the linear motors, the slider 14 and the mass middle point of the X-beam 11 are not at the same position, moving the wafer table WT may cause vibrations in the X-beam 11. The vibrations may be in all directions.

Figure 3:
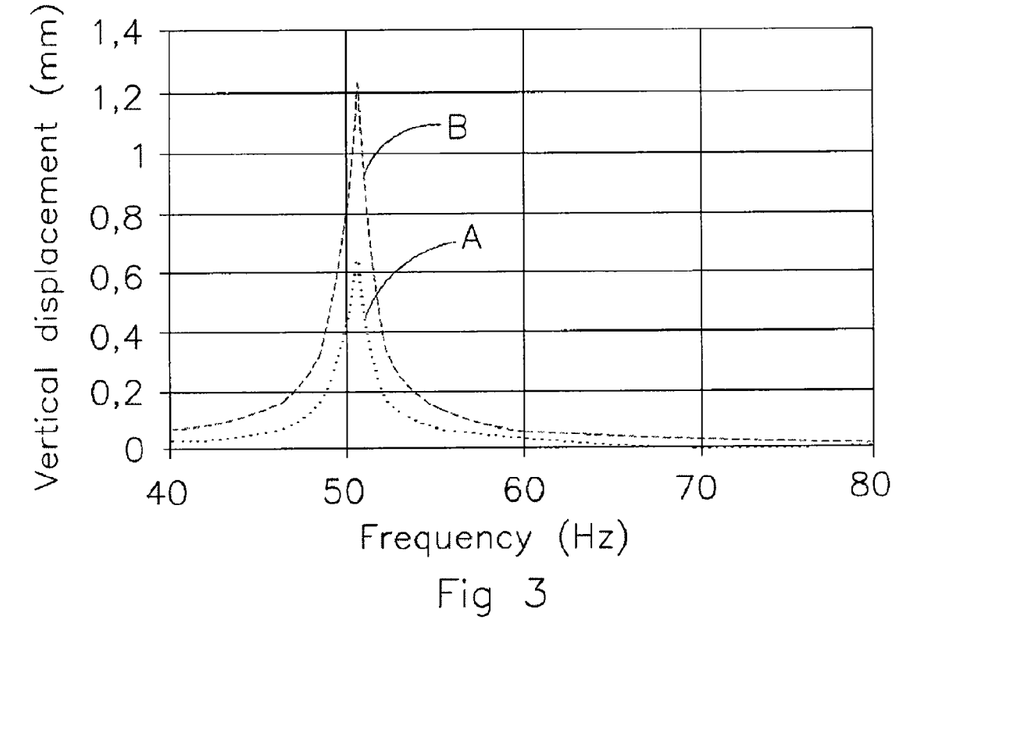
FIG. 3 shows displacements in the Z-direction that can be caused by vibration in the X-beam, according to an embodiment of the invention.

FIG. 3 shows displacements in the Z-direction that can be caused by vibration in the X-beam, according to an embodiment of the invention. FIG. 3 shows the vibrations in the Z-direction of the X-beam 11 with line A and the vibrations of slider 14 sliding over the X-beam 11 with line B. The vibrations in the Z-direction are caused by moving the wafer table WT. For example, around 50 Hz there may be sensitivity to vibrations. The vibrations may lead to inaccuracies of the positioning of the WT, may cause wear in the leaf springs which connect the X-beam to sliders 12a, 12b and/or may cause wear in the connection of the wafer table WT to the slider 14.

Figure 4:
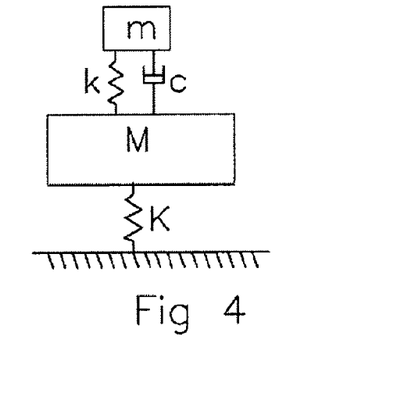
FIG. 4 shows a schematic picture of a vibration damper, according to an embodiment of the invention.

FIG. 4 shows a schematic picture of a vibration damper, according to an embodiment of the invention. FIG. 4 shows a vibration damper e.g., a tuned mass damper including a mass m connected with a spring k and a damper c to a mass M. K represents the stiffness in the Z direction of the X-beam with respect to the ground and M the modal mass of the X-beam. The mass m is damping the vibrations of the mass M.

Figure 5:
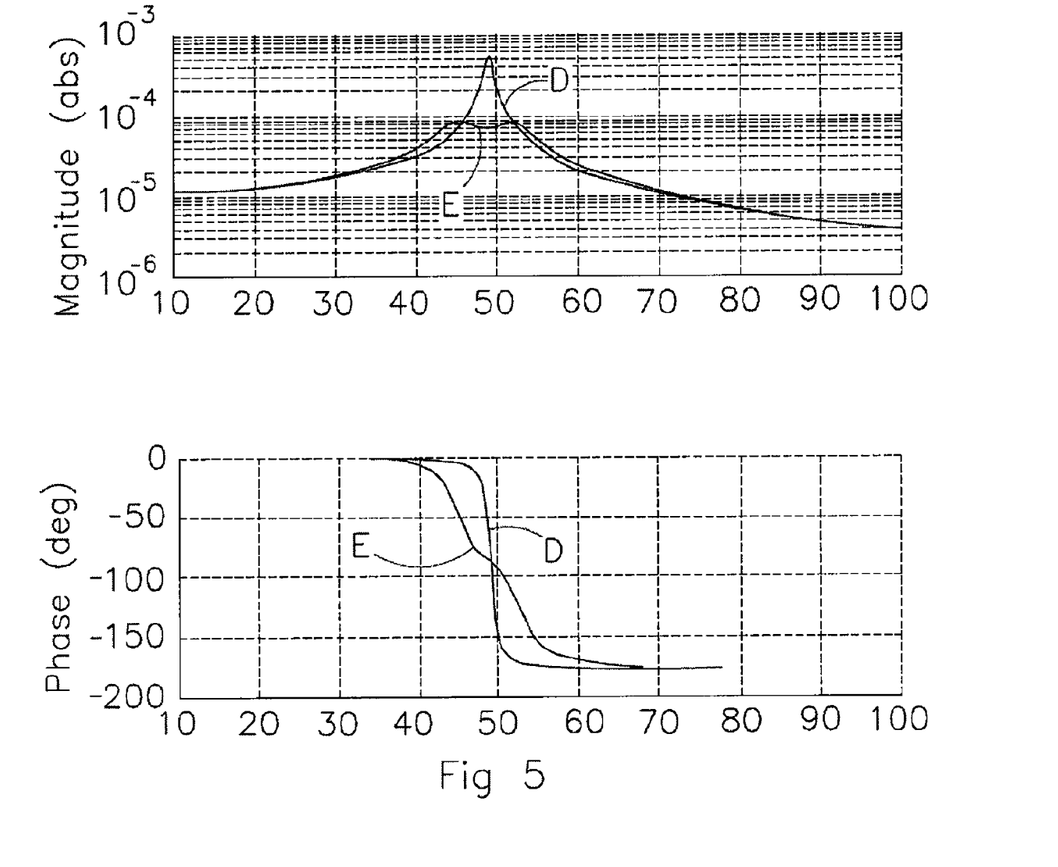
FIG. 5 shows the damping of the vibration damper of FIG. 4, according to an embodiment of the invention.

FIG. 5 shows the damping of the vibration damper of FIG. 4, according to an embodiment of the invention. FIG. 5 shows the transfer function of the X-beam without vibration damping by a tuned mass damper (see line D). FIG. 5 shows that with a mass m of about 0.6 Kg the magnitude of the vibrations at about 50 Hz (see line E) for the mass M is lower than with a mass m of about $1e^{-6}$ (see line D) and that the phase change with a mass m of about 0.6 Kg is much less abrupt than with a mass m of about $1e^{-6}$. The tuned mass damper can be tuned to be sensitive for certain vibrations by changing the spring constant k and can be used to damp vibrations in the X-beam 11. At about 50 Hz there is a very light damped Eigen frequency of the X-beam. By adding the tuned mass damper the light damped resonance peak is replaced by two damped resonance peaks (see line E). The mass ratio $\mu=m/M$ determines the amplitude reduction. The higher the ratio, the larger the possible amplitude reduction may be. The large amplitude reduction is however only achieved, when tuned mass damp-ing constant c and tuned mass damper frequency f are optimal. The optimal frequency equals $f_{opt}=1/(1+\mu)*f_{Xbeam}$. The frequency can be tuned by changing the spring constant k at a frequency $f_{Xbeam}$ and a chosen mass $m(f=1/(2\pi)\sqrt{(k/m)}$. The optimal damping equals $\beta_{opt}=\sqrt{(3\mu/(8(1+\mu))}$. The damping can be tuned by changing the damping constant c at a frequency $f_{Xbeam}$ and a chosen $m(c=2\beta_{opt}m(2\pi f_{Xbeam})$.

Figures 6, 7:
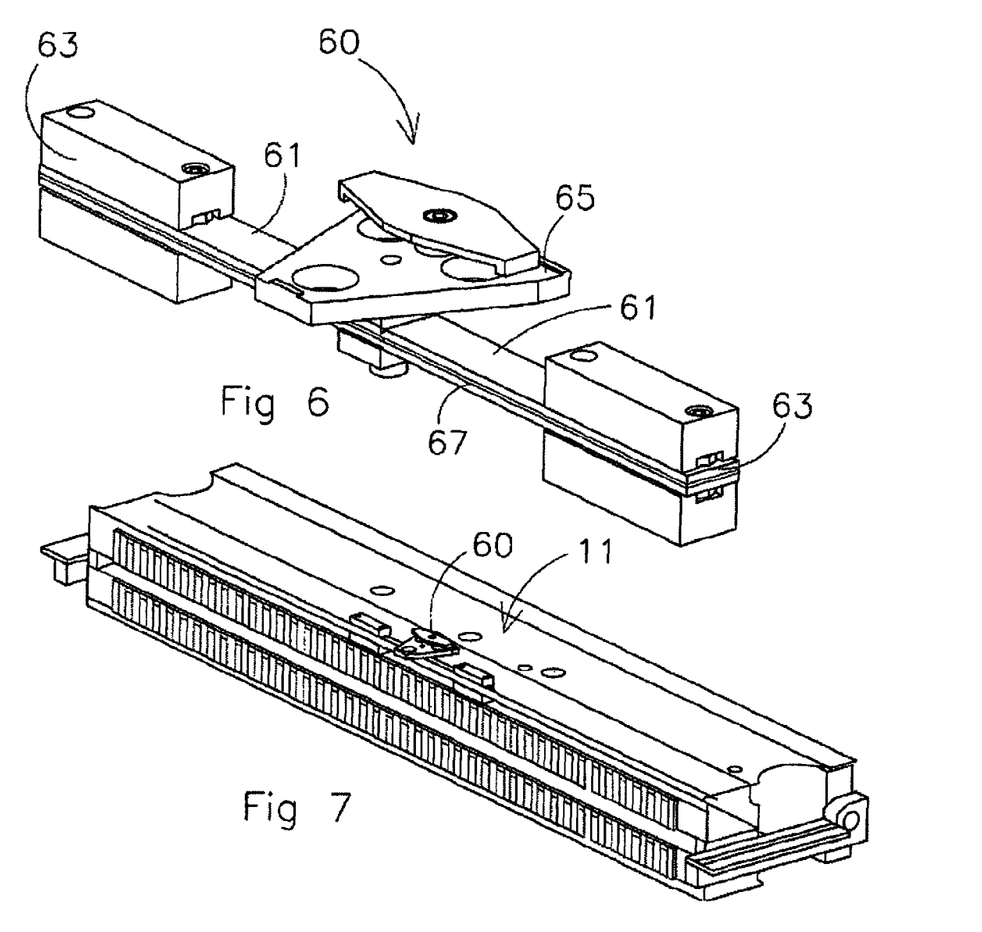
FIG. 6 shows a mass damper, according to an embodiment of the invention.
FIG. 7 shows an X-beam provided with the vibration damper, according to an embodiment of the invention.

FIG. 6 shows a mass damper, according to an embodiment of the invention. FIG. 6 shows a vibration damper 60, e.g., a tuned mass damper with two leaf springs 61 connecting two masses 63 to the beam via a connection 65 according to an embodiment of the invention. Leaf spring 61 includes a layer 67 of an elastic material, for example VITON® made by DUPONT®. The layer 67 of elastic material is sandwiched between two steel layers. The thickness and length of the steel layers largely determine the Eigen frequency of the tuned mass damper. The amount of VITON® determines the damping and absorbs the vibration energy of the masses 63. A benefit of the mass damper 60 with leaf springs 61 connecting two masses 63 is that multiple modes of vibration are possible with each mode having its particular optimum of suppressing vibrations of a particular frequency. For example, a mode of vibrations at about 48.6 Hz is possible in which both masses 63 move in phase with the X-beam 11, another mode at about 49.6 Hz has one mass moving in phase with the X-beam 11 while the other one is moving in opposite phase and a mode is possible at about 52.5 Hz in which both masses 63 are moving in opposite phase as the X-beam 11. Another benefit of the tuned mass damper 60 with leaf springs 61 connecting two (or more) masses 63 is that by slightly mistuning the Eigen frequency of the masses, it is possible to reduce X-beam amplitudes over a wider frequency range. Also, the Eigen frequency of the tuned mass damper can be tuned independent of damping. The steel layer thickness and length determine Eigen frequency and the amount of visco-elastic material determines the damping.

FIG. 7 shows an X-beam provided with the vibration damper, according to an embodiment of the invention. FIG. 7 shows the mass damper 60 mounted in the X-beam 11. The mass damper 60 is mounted such that the masses 63 can freely move in the Z direction so as to absorb the vibrations in the Z direction.

Figure 8:
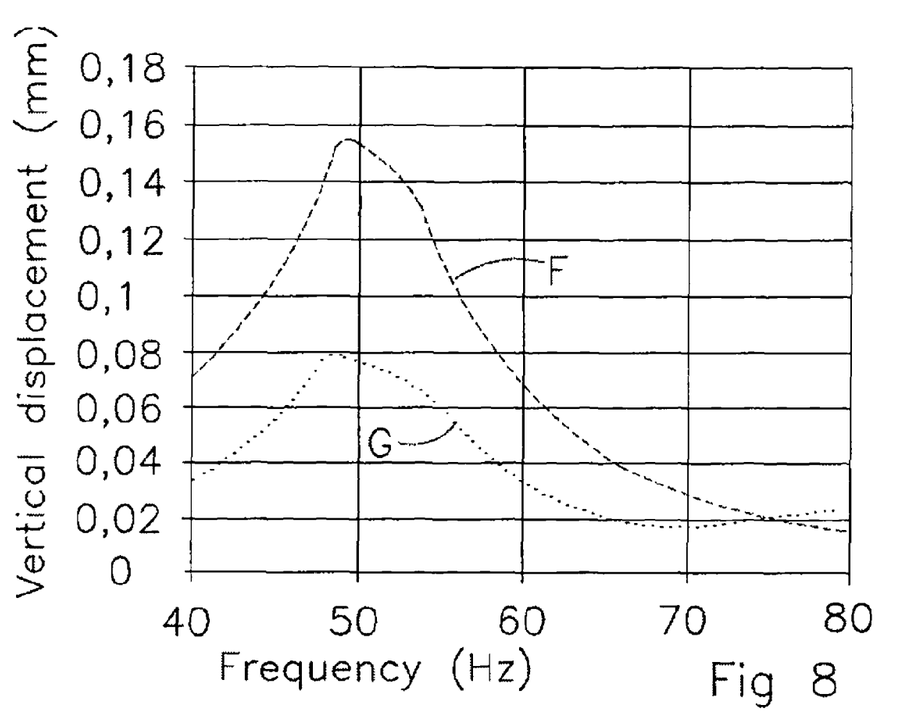
FIG. 8 shows displacements in the Z-direction after the X-beam is provided with a vibration damper, according to an embodiment of the invention.

FIG. 8 shows displacements in the Z-direction after the X-beam is provided with a vibration damper, according to an embodiment of the invention. FIG. 8 shows the vibration in the Z direction after the damper is mounted to the X-beam 11. The displacements in the Z direction F for the slider 14 and the displacements in the Z direction G of the X-beam 11 are shown. The damper suppresses the vibrations in the X-beam 11 and the slider 14 with a factor eight (compare FIG. 3 with FIG. 8).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   a support constructed to support a patterning device, the patterning device being capable of imparting a radiation beam with a pattern in its cross-section to form a patterned radiation beam;
   a substrate table constructed to hold a substrate;
   a projection system configured to project the patterned radiation beam onto a target portion of the substrate;
   an actuator configured to exert a force on a part of the lithographic apparatus via an elongated structure; and
   a vibration damper configured to damp vibrations in the elongated structure, the vibration damper having at least two masses each mounted to the elongated structure via a spring and a damper mechanism.

2. The lithographic apparatus according to claim 1, wherein the part is the support or the substrate table.

3. The lithographic apparatus according to claim 1, wherein the actuator comprises linear motors constructed and arranged to exert a force on the part via the elongated structure.

4. The lithographic apparatus according to claim 1, wherein the spring is a leaf spring.

5. The lithographic apparatus according to claim 4 wherein the damper mechanism is an elastic material connected to the leaf spring.

6. The lithographic apparatus according to claim 5, wherein the elastic material is sandwiched between two steel sheets of the leaf spring.

7. The lithographic apparatus according to claim 1, wherein the at least two masses are connected to the elongated structure with a leaf spring comprising two steel sheets with an elastic material sandwiched between the two steel sheets.

8. A device manufacturing method comprising:
   providing a substrate that is at least partially covered by a layer of radiation-sensitive material on a substrate table;
   providing a patterning device on a support;
   projecting a patterned beam of radiation onto the layer of radiation sensitive material;
   exerting a force on the substrate table, or the support or both with an actuator via an elongated structure; and
   substantially suppressing vibrations within the elongated structure with a vibration damper, the vibration damper having at least two masses each mounted to the elongated structure via a spring and a damper mechanism.

9. The method of claim 8, further comprising:
   developing the layer of sensitive material on the substrate; and
   manufacturing a device from the developed substrate.

10. The method of claim 8, further comprising mistuning the Eigen frequencies of the at least two masses.

11. The method of claim 10, wherein mistuning the Eigen frequencies reduces vibrations of the elongated structure over a substantially wider frequency range.

* * * * *